United States Patent
Gregor et al.

[11] Patent Number: 6,008,091
[45] Date of Patent: Dec. 28, 1999

[54] FLOATING GATE AVALANCHE INJECTION MOS TRANSISTORS WITH HIGH K DIELECTRIC CONTROL GATES

[75] Inventors: Richard William Gregor, Winter Park; Isik C. Kizilyalli, Orlando; Pradip Kumar Roy, Orlando, all of Fla.

[73] Assignee: Lucent Technologies Inc., Murray Hill, N.J.

[21] Appl. No.: 09/014,030

[22] Filed: Jan. 27, 1998

[51] Int. Cl.⁶ .................................................. H01L 29/788
[52] U.S. Cl. .......................... 438/261; 438/240; 438/257; 438/266; 438/593
[58] Field of Search ..................... 438/240, 593, 438/757, 266, 261, 594; 257/325, 316

[56] References Cited

U.S. PATENT DOCUMENTS

| | | | |
|---|---|---|---|
| 3,878,549 | 4/1975 | Yamazaki et al. | 148/DIG. 43 |
| 4,613,956 | 9/1986 | Paterson et al. | 257/315 |
| 4,630,086 | 12/1986 | Sato et al. | 257/316 |
| 4,698,787 | 10/1987 | Mukherjee et al. | 257/316 |
| 4,720,323 | 1/1988 | Sato | 438/261 |
| 4,943,836 | 7/1990 | Mori | 257/323 |
| 5,104,819 | 4/1992 | Freiberger et al. | 438/593 |
| 5,619,051 | 4/1997 | Endo | 257/316 |
| 5,739,566 | 4/1998 | Ota | 257/315 |

*Primary Examiner*—Carl Whitehead, Jr.
*Assistant Examiner*—Maria Guerrero

[57] ABSTRACT

The specification describes intergate dielectrics between the floating silicon gate and the control silicon gate in MOS memory devices. The intergate dielectrics are composite structures of $SiO_2$—$Ta_2O_5$—$SiO_2$ with the first $SiO_2$ layer grown on the floating gate,, and all layers preferably produced in situ in an LPCVD reactor. After formation of the composite $SiO_2$—$Ta_2O_5$—$SiO_2$ dielectric, it is annealed at low pressure to densify the $SiO_2$ layers. Electrical measurements show that the charge trap density in the intergate dielectric is substantially lower than in layered dielectrics produced by prior techniques.

9 Claims, 2 Drawing Sheets

FLOATING GATE AVALANCHE INJECTION MOS TRANSISTORS WITH HIGH K DIELECTRIC CONTROL GATES

FIELD OF THE INVENTION

The invention relates to modified control gate structures for reducing the read-write voltage in stacked gate programmable IGFET devices.

BACKGROUND OF THE INVENTION

As the size and speed of silicon devices shrink current leakage and other reliability problems increase. In flash memories, fast program/erase times and operating voltage reductions are the primary issues facing the continued development of improved devices. With a given budget for operating voltages the main option for the device designer is a trade-off between low power and high speed. The operating voltage scales with device dimensions which are relatively fixed for the current generation of technology. Thus the most promising option left for device improvement is to increase the coupling ratio by increasing the floating gate capacitance.

The main options for increasing the floating gate capacitance are to reduce the intergate dielectric thickness or to alter the dielectric properties of the intergate dielectric material. Device and process designers to date have recognized that as the intergate dielectric thickness shrinks, the potential for leakage and other electrical defects increases. Thus the quality of the dielectric material used is important. The highest quality material so far developed in silicon technology for low defects and for low surface state density is $SiO_2$. An important advantage of $SiO_2$ is that it can be grown from the underlying poly gate. It is well known that grown oxides tend to have fewer defects, e.g. pinholes, than deposited materials. Thus $SiO_2$ has persisted as the dielectric material of choice in most silicon device structures.

In spite of the popularity of $SiO_2$ as a dielectric material, some efforts to increase floating gate capacitance have focused on newly developed dielectric materials. The use of $Ta_2O_5$ as a dielectric has been proposed for MOSFETs (see Youichi Momiyama et al, "Ultra-Thin $Ta_2O_5/SiO_2$ Gate Insulator with TiN Gate Technology for 0.1 µm MOSFETs", 1997 Symposium on VLSI Technology Digest of Technical Papers, pp. 135,136. This material has also been proposed for stacked and trench capacitors in DRAM structures (see Tomonori Aoyama et al, "Leakage Current Mechansim of Amorphous and Polycrystalline $Ta_2O_5$ Films Grown by Chemical Vapor Deposition", J. Electrochem. Soc., Vol. 143, No. 3, pp. 977–983, March 1996.

Efforts to develop new dielectric materials for flash memories have also been reported. See e.g. W-H Lee et al, "A Novel High K Inter-Poly Dielectric (IPD), $Al_2O_3$ for Low Voltage/High Speed Flash Memories: Erasing in msecs at 3.3V", 1997 Symposium on VLSI Technology Digest of Technical Papers, pp. 117,118. The essence of this proposal is to substitute $Al_2O_3$ for $SiO_2$ as the dielectric between the control gate of the flash memory and the floating gate. Alumina has a dielectric constant approximately twice that of the widely used $SiO_2$ dielectric, thus giving substantial improvement in the capacitance between the polysilicon control gate and the polysilicon floating gate.

While many of these new proposals show promise, a growing issue in these devices is the quality of the dielectric interfaces in multi-layer structures. As the dimensions of storage devices shrinks, and the operating power levels are reduced, the amount of electrical charge that represents a one or zero in a binary bit stream declines as well. With a relatively small number of charges distinguishing between data bit states, a significant loss of charge through recombination at interface defects can reduce the signal to noise ratio of the device to unacceptable margins. Thus while modification of the dielectric composition of interlevel gate dielectrics theoretically achieves new benefits, in practice the processing used to form these new structures is important in realizing the theoretical advantages.

SUMMARY OF THE INVENTION

We have developed a new floating gate structure with improved dielectric properties that is especially suitable for flash memory devices with polysilicon gates. The gate structure is a composite of at least three layers. A first interface layer of $SiO_2$ is used at the lower polygate interface to obtain a high quality electric interface. The $SiO_2$ layer is ultra-thin, in a range generally considered too thin to prevent pinholes and leakage problems, i.e. is inadequate for a gate dielectric. The $SiO_2$ interface layer is covered with a layer of high K $Ta_2O_5$ and a thin capping layer of $SiO_2$. The thickness of the composite layered dielectric can be greater than the thickness of a prior art $SiO_2$ intergate dielectric with optimized thickness, but the overall K of the composite dielectric constant can be substantially less. The use of a thicker intergate dielectric, with process integration and defect potential comparable to that of $SiO_2$ but with a higher K, represents a significant advance in flash memory technology. The process used to form this structure results in high quality interfaces, thereby minimizing the number of defect sites at the interfaces, and reducing the loss of charge through unwanted recombination.

DETAILED DESCRIPTION

Figure 1:
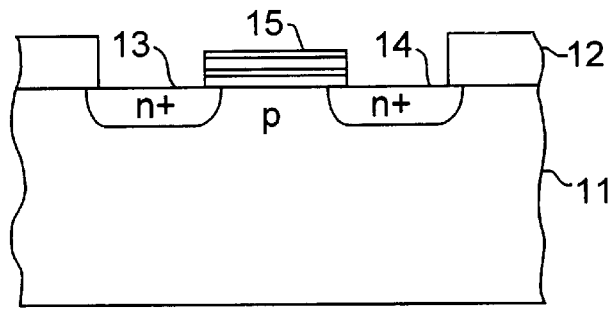
FIG. 1 is a schematic diagram of a typical flash memory device.

Referring to FIG. 1, the essential elements of a flash memory device are illustrated and include silicon substrate 11, source 13 and drain 14. These are shown as n-type regions for an n-channel device, but may be p-type for CMOS devices. The field oxide is shown at 12, and the gate structure at 15.

Figure 2:
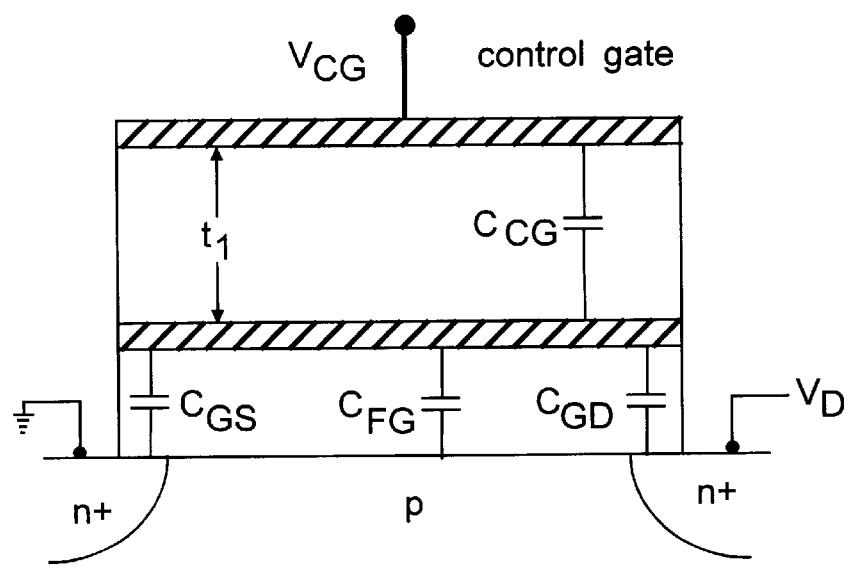
FIG. 2 is an enlarged view of the floating gate structure of FIG. 1.

The gate structure 15 of FIG. 1 is shown in detail in FIG. 2. The important parameters are designated in the figure and relate to one another according to the following:

The voltage on the floating gate is:

Equation (1):

$$V_{FG} = \frac{C_{GD} \times V_D}{C_{GD} + C_{GS} + C_{FG} + C_{CG}} + \frac{C_{GD} \times V_{CG}}{C_{GD} + C_{GS} + C_{FG} + C_{CG}}$$

where $C_{GD}$ is the capacitance between the floating gate and the drain, $V_D$ is the drain voltage, $C_{GS}$ is the capacitance between the floating gate and the source, $C_{FG}$ is the capacitance between the floating gate and the substrate, is the capacitance between the floating gate and the control gate, and $V_{CG}$ is the control gate voltage.

It is desirable that the coupling between the control gate and the floating gate be high, therefore the $C_{CG}$ term in equation (1) should be large. This capacitance is determined by:

Equation (2):

$$C_{CG} \approx \frac{\varepsilon_i}{t_1} \times A$$

where $\varepsilon_i$ is the dielectric constant for the insulating layer between the gates, and $t_1$ is the thickness of the insulating layer, and A is the gate area.

In state of the art device technology the thickness of the intergate dielectric $t_1$ is generally optimized, i.e. it cannot practically be reduced further. Consequently, the only remaining option is to increase the dielectric constant of the intergate material.

Many insulating materials are available with dielectric constants higher than that of the commonly used insulator, $SiO_2$. $SiO_2$ has a dielectric constant $\varepsilon_i$ of 3.9. Among other candidates $Ta_2O_5$ is attractive, with a $\varepsilon_i$ of 25. However, $Ta_2O_5$ has a relatively low barrier height making it apparently unsuitable for floating gate devices, although it has been proposed for other MOS devices. It is known in that art that the demands on the characteristics and quality of insulating materials are particularly high for floating gate structures.

According to the invention, composite intergate dielectric structures are employed to overcome the interface problem described above. The primary gate dielectric, i.e. the dielectric between the floating gate and the silicon substrate is a conventional gate dielectric which is thin to accommodate tunneling of carriers from the substrate during programming. The intergate dielectric, between the polysilicon floating gate and the polysilicon control gate, is produced according to the invention and comprises a first $SiO_2$ layer with a thickness of less than 50 Angstroms and preferably in the range 10–30 Angstroms grown on the polysilicon floating gate. This layer provides both a compatible interface with polysilicon and, due to its relatively high bandgap, provides an effective barrier against current leakage. A thicker layer of $Ta_2O_5$ is deposited on the first $SiO_2$ layer, and a capping $SiO_2$ layer is deposited on the $Ta_2O_5$. The $Ta_2O_5$ layer provides enhanced dielectric properties, and the initial $SiO_2$ layer is included primarily to provide a high quality interface with the polysilicon floating gate. The capping $SiO_2$ layer provides a similar high quality interface with the control gate. The capping $SiO_2$ layer is deposited but during a post anneal, after formation of the multi-layer stack, slight growth occurs at both polysilicon-$SiO_2$ interfaces, so that the morphology and electrical characteristics of the interface between the capping $SiO_2$ layer and the polysilicon control gate resembles that of a high quality grown oxide. The thickness of the $Ta_2O_5$ layer is generally in the range 30–100 Angstroms. The recommended thickness for the $SiO_2$ capping layer is 5–30 Angstroms. The recommended overall thickness of the three layer composite dielectric is in the range 45–150 Angstroms and preferably 45–100 Angstroms.

Figure 3:
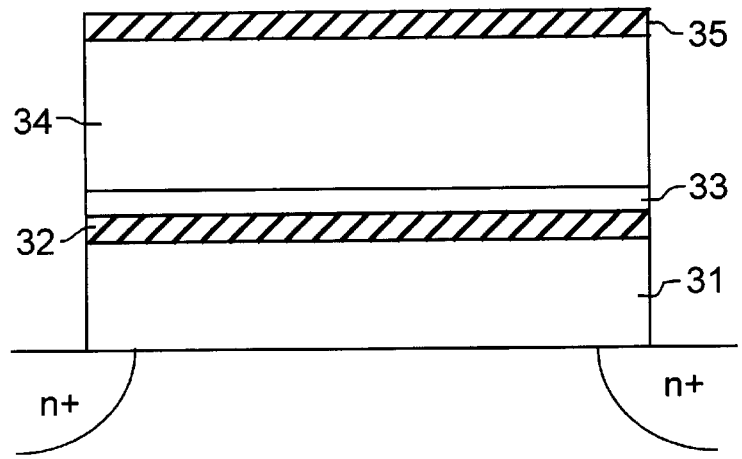
FIGS. 3 and 4 are views similar to that of FIG. 2 showing gate structures according to the invention.

The composite layered intergate dielectric according to the invention is shown in FIG. 3. The whole gate structure includes a first dielectric layer 31 between the floating gate 32 and the substrate 30. The first dielectric layer is typically $SiO_2$ and is thermally grown using well known techniques. The first layer is thin to allow tunneling of electrons through the layer during programming. The electrons are stored on floating gate 32. The intergate dielectric between the floating polysilicon gate 32 and the polysilicon control gate 33 is shown at generally at 34, and is a stacked dielectric structure of a first $SiO_2$ layer 35, a $Ta_2O_5$ layer 36, and a second $SiO_2$ layer 37.

Figure 4:
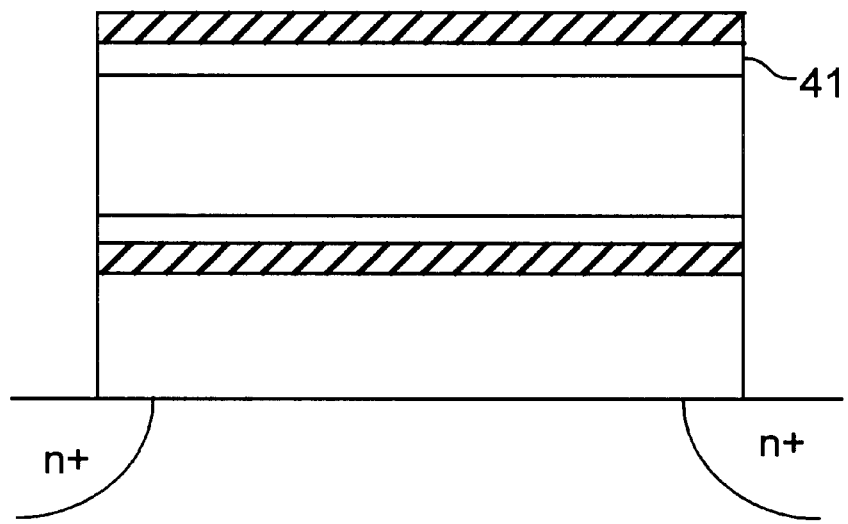

An alternative composite layer gate stack is shown in FIG. 4. The initial layer 41 on the floating gate 32 is grown $SiO_2$ as described above. Layer 42 is $Ta_2O_5$, layer 43 is a layer of deposited $SiO_2$, layer 44 is $Ta_2O_5$, and layer 45 is deposited $SiO_2$. The combined thickness of the composite layered structure is in the range 50–150 Angstroms. The thickness of the individual layers is typically 10–50 Angstroms. The multilayer structure of FIG. 4 appears to be more complex than the structure of FIG. 3, but because these layers are conveniently formed by LPCVD in the same low pressure vacuum apparatus the number of layers used in the structure is relatively immaterial from the standpoint of process integration and cost.

Figure 5:
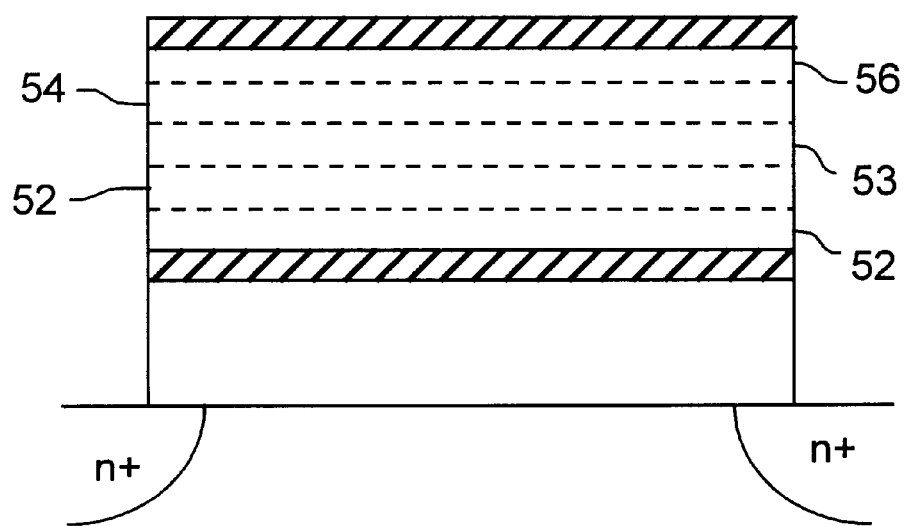
FIG. 5 is a representation of process steps in accordance with the invention.

As just indicated the preferred technique for producing the multilayer intergate dielectric structures according to the invention is by LPCVD. A typical process sequence is shown in FIG. 5. A portion of the silicon substrate is shown at 51, covered with dielectric layer 52 and control gate 53. The control gate material is referred to herein as polysilicon, which generally means it has a substantial crystalline morphology. However, it should be understood that it can also be amorphous silicon, the degree of crystallinity being largely immaterial to the invention. Consequently, for the purpose of definition here and in the appended claims when the gate material is specified as "silicon" it is meant to cover either amorphous or polysilicon.

The first step in forming the intergate dielectric in the sequence represented in FIG. 5 is to grow a thin layer 54 of $SiO_2$. The preferred growth technique is by low pressure reaction in an LPCVD reactor. The recommended growth temperature is 700–950° C., and preferably 800–900° C. The recommended pressure is in the range 0.7–1.0 mTorr and preferably 0.8–0.9 mTorr.

The second step represented in FIG. 5 is to deposit $Ta_2O_5$ layer 55 by low pressure chemical vapor deposition (LPCVD). The recommended temperature is in the range 300–500° C. and preferably approximately 375–430° C. The recommended pressure is in the range 50–200 mTorr and preferably approximately 75–150 mTorr. Precursors for the CVD deposition are selected from those known in the art, e.g. $Ta(OC_2H_5)_5$ and $O_2$ in an argon carrier gas. Typical deposition rates are 30–100 Angstroms/min.

The thin capping $SiO_2$ layer 56 is deposited by LPCVD at a temperature in the range 500–750° C. and preferably in the range 600–700° C., and a pressure in the range 150–350 mTorr and preferably in the range 200–300 mTorr. Appropriate precursor materials for this deposition are TEOS and $O_2$.

After the multilayer gate dielectric stack is formed a post anneal is performed to densify the $SiO_2$ and relieve stress in the layers. This step is performed at conditions similar to those for $SiO_2$ growth but at a reduced temperature. During this post anneal the electrical characteristics of the interfaces between the polysilicon and the $SiO_2$ layers are improved. The recommended temperature for the post anneal is in the range 550–750° C., and preferably in the range 600–700° C. It is convenient to perform this anneal at the same temperature used in the prior step. The recommended pressure is in the range 0.7–1.1 Torr and preferably in the range 0.8–1.0 Torr. The atmosphere for the anneal is preferably $O_2$ or $N_2O$ and the anneal time is preferably in the range 15 to 100 min., the shorter anneal times corresponding with higher temperatures in the recommended temperature range.

The four steps represented in FIG. 5 are preferably carried out sequentially in situ, which is intended to mean in the same low pressure reactor without removing the substrate between steps and preferably without breaking the vacuum. The appropriate process conditions for each step are carried out by simply adjusting the pressure and temperature in the LPCVD reactor and changing the composition of the atmosphere within the reactor by suitable inlet valves which are conventional with equipment of this kind. This preferred in situ technique is believed to be partly responsible for the superior results obtained when compared with other prior art techniques.

After completion of the gate stack and post anneal, a 10–30 min. plasma treatment at 350–450° C. using a glow discharge at 100–500 W and 50 kHz is recommended to further reduce the dielectric leakage current. Preferred conditions for this treatment are 15 min. at 400° C. and 400 W.

Thereafter the silicon control gate is deposited by a known technique, e.g. CVD or evaporation, to complete the MOS memory device.

MOS devices with $SiO_2$—$Ta_2O_5$—$SiO_2$ composite intergate dielectrics were fabricated to demonstrate the effectiveness of the process and the resulting structures. The process conditions were those given in FIG. 5. Electrical characterization of the dielectrics were performed using the non-contact corona-oxide-semiconductor measurement technique described by P. K. Roy et al, Electrochem. Soc. Ext. Abst., 478 (1997); R. Williams et al, J. Appl. Phys. 44, 1026 (1973); R. L. Verkuil et al, Electrochem. Soc. Ext. Abst. 88–1, 261 (1988); T. G. Miller, Semiconductor International 18(7), 211 (1995); M. S. Fung, Semiconductor International 20(8), 211 (1997); G. Horner et al, Solid State Technology, 38,79 (1995). The corona-oxide-semiconductor technique utilizes a combination of of charge deposition ($\Delta Q$), non-contact surface voltage ($V_s$) measurements, and surface photovoltage (SPV) response to build a quasi-static sweep analogous to a low frequency capacitance-voltage (C-V) measurement. This technique of thin dielectric characterization is significantly simpler than the conventional C-V characterization of a MOS capacitor since polysilicon depletion effects and probe punch-through are eliminated. The dielectric thickness ($t_{eff}$) is obtained from the slope of the Q-$V_s$ curve in the accumulation regime. The extracted effective intergate dielectric thickness for the $SiO_2$—$Ta_2O_5$—$SiO_2$ stack and the dielectric resistivity of $\rho = 6.2 \times 10^{15}$ $\Omega$cm are determined using the same sweep (in the strong accumulation regime ). The density of interface trap charge $D_i$ is estimated from the quasi-static analysis of the measured and theoretical Q-$V_s$ curve using the Berglund method (see C. N. Berglund, IEEE Trans. Electron Devices, ED-31, 701 (1966). The calculated values of $D_i = 1-3 \times 10^{11}$ $eV^1cm^{-2}$ for both the stacked $SiO_2$—$Ta_2O_5$—$SiO_2$ structure thermally grown $SiO_2$ on silicon are quite typical. The interface trap charge $D_i$ is much reduced after the samples are annealed in forming gas ($H_2/N_2$) ambients at low ( 400–450° C.) temperature (see E. H. Nicollian et al, (*Metal Oxide Semiconductor*) *Physics and Technology*, John Wiley and Sons, New York (1982). High electric field oxide leakage currents through the dielectric are measured by applying high bias charge densities ($10^{-1}$ C/$cm^2$ ) to induce tunneling. The maximum surface voltage ($V_{s,max}$) clamped by the tunneling of carriers through the oxide is equal to the tunneling voltage ($V_{tunnel}$). The tunneling voltage represents an upper limit for CMOS integrated circuit operation (supply) voltage.

These measurements established that no significant hysteresis in the SPV vs.$V_s$ plot exists thereby demonstrating that charge trapping problems inherent in prior art composite (layered) MOS dielectric structures were eliminated using the technique of the invention.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. Method for the manufacture of a MOS silicon device comprising the steps of:
   a. forming a first dielectric layer on a silicon substrate,
   b. forming a silicon floating gate on the first dielectric layer,
   c. forming a second dielectric layer on the silicon floating gate, and
   d. forming a silicon control gate on the second dielectric layer, the invention characterized in the second dielectric layer is a composite layer of $SiO_2$—$Ta_2O_5$—$SiO_2$ formed by the steps of:
      i. growing a first $SiO_2$ layer on the silicon floating gate, said first $SiO_2$ layer having a thickness in the range 10–30 Angstroms,
      ii. depositing a layer of $Ta_2O_5$ on the first $SiO_2$ layer, said layer of $Ta_2O_5$ having a thickness in the range 30–100 Angstroms, and
      iii. depositing a second layer of $SiO_2$ over said layer of $Ta_2O_5$ said second layer of $SiO_2$ having a thickness in the range 5–30 Angstroms, the invention further characterized in that the overall thickness of the $SiO_2$—$Ta_2O_5$—$SiO_2$ composite layer is in the range 45–100 Angstroms.

2. The method of claim 1 further including the step of annealing the $SiO_2$—$Ta_2O_5$—$SiO_2$ composite layer at a temperature in the range 550–750° C.

3. The method of claim 2 wherein the steps i–iii are carried out in a LPCVD reactor and each step is carried out in situ.

4. The method of claim 3 wherein the silicon control floating gate and the silicon gate are polysilicon.

5. The method of claim 4 wherein the first dielectric layer is $SiO_2$.

6. Method for the manufacture of an MOS silicon device comprising the steps of:
   a. forming a first dielectric layer on a silicon substrate,
   b. forming a silicon floating gate on the first dielectric layer,
   c. forming a second dielectric layer on the silicon floating gate, and
   d. forming a silicon control gate on the second dielectric layer, the invention characterized in the second dielectric layer is a composite layer of $SiO_2$—$Ta_2O_5$—$SiO_2$ formed by the steps of:
      i. placing the silicon substrate in a LPCVD reactor,
      ii. heating the silicon substrate to a temperature in the range 700–950° C.,
      iii. growing a first $SiO_2$ layer on the silicon floating gate in an atmosphere comprising oxygen at a pressure in the range 0.7–1.0 Torr to produce a $SiO_2$ layer having a thickness in the range 10–30 Angstroms,
      iv. adjusting the temperature of said silicon substrate to a temperature in the range 300–500° C.,
      v. adjusting the pressure in said LPCVD reactor to a pressure in the range 50–200 mTorr,
      vi. introducing precursor gases into said LPCVD reactor to deposit a layer of $Ta_2O_5$ on the first $SiO_2$ layer, said layer of $Ta_2O_5$ having a thickness in the range 30–100 Angstroms, vii. adjusting the temperature of said silicon substrate to a temperature in the range 500–750° C., viii. adjusting the pressure in said LPCVD reactor to a pressure in the range 150–350° C., ix. introducing an oxide precursor gas into said LPCVD reactor and depositing a second layer of $SiO_2$ over said layer of $Ta_2O_5$, said second layer of $SiO_2$ having a thickness in the range 5–30 Angstroms, thereby forming a composite layer of $SiO_2$—$Ta_2O_5$—$SiO_2$, x. adjusting the temperature of said silicon substrate to a temperature in the range 550–750° C., xi. adjusting the pressure in said LPCVD reactor to a pressure in the range 0.7–1.1 Torr, and xii. annealing the composite layer of $SiO_2$—$Ta_2O_5$—$SiO_2$ for a period of 15 to 100 min, the invention further characterized in that the overall thickness of the $SiO_2$—$Ta_2O_5$—$SiO_2$ composite layer is in the range 45–100 Angstroms.

7. The method of claim 6 wherein the atmosphere in said LPCVD reactor during step xii. is selected from the group consisting of $O_2$ and $N_2$.

8. The method of claim 6 in which the temperature in step ii. is in the range 800–900° C., the pressure in step iii is in the range 0.8–0.9 Torr, the temperature in step iv. is in the range 375–430° C., the pressure in step v. is in the range 75–150 mTorr, the temperature in step vii. is in the range 600–700° C., the pressure in step viii. is in the range 200–300 mTorr, the temperature in step x. is in the range 600–700° C., and the pressure in step xi. is in the range 0.8–1.0 Torr.

9. The method of claim 6 wherein steps iv. through ix. are repeated.

* * * * *